United States Patent [19]

Oguey

[11] Patent Number: 5,239,500

[45] Date of Patent: Aug. 24, 1993

[54] PROCESS OF STORING ANALOG QUANTITIES AND DEVICE FOR THE IMPLEMENTATION THEREOF

[75] Inventor: Henri J. Oguey, Corcelles, Switzerland

[73] Assignee: Centre Suisse D'Electronique et de Microtechnique S.A., Neuchatel, Switzerland

[21] Appl. No.: 972,093

[22] Filed: Nov. 5, 1992

Related U.S. Application Data

[63] Continuation of Ser. No. 589,675, Sep. 28, 1990, abandoned.

[30] Foreign Application Priority Data

Sep. 29, 1989 [FR] France ................................ 89 12739

[51] Int. Cl.$^5$ .............................................. G11C 27/00
[52] U.S. Cl. ...................................... 365/45; 365/185; 257/321
[58] Field of Search ....................... 365/45, 185, 184; 357/23.5; 257/321

[56] References Cited

U.S. PATENT DOCUMENTS

| | | |
|---|---|---|
| 4,057,788 | 11/1977 | Sage . |
| 4,181,980 | 1/1980 | McCoy . |
| 4,192,014 | 3/1980 | Craycraft ............................ 365/45 |
| 4,627,027 | 12/1986 | Rai et al. . |
| 4,931,847 | 6/1990 | Corda ................................ 357/23.5 |
| 4,979,146 | 12/1990 | Yokoyama et al. ................. 357/23.5 |
| 4,982,377 | 1/1991 | Iwasa ................................. 365/185 |
| 5,017,803 | 5/1991 | Yoshida ............................. 365/185 |

Primary Examiner—Joseph E. Clawson, Jr.
Attorney, Agent, or Firm—Parkhurst, Wendel & Rossi

[57] ABSTRACT

The process according to the invention is applicable to a non-volatile memory cell with an MOS transistor structure with an insulated floating gate, a control electrode coupled capacitively to the floating gate and an injection zone separated from the floating gate by an injection oxide and capable of injecting or extracting charges into or from the floating gate. The process is characterized in that the control electrode is subjected to an alternating voltage of decreasing amplitude and the injection zone is subjected to a voltage representing the quantity to be stored. The invention applies to the storage of analog quantities.

14 Claims, 6 Drawing Sheets

PROCESS OF STORING ANALOG QUANTITIES AND DEVICE FOR THE IMPLEMENTATION THEREOF

This is a continuation of application Ser. No. 07/589,675 filed Sept. 28, 1990, now abandoned.

BACKGROUND OF THE INVENTION

1. Field of the Invention

The present invention relates to non-volatile memory devices and relates more particularly to a process and a device enabling the storage of analog quantities.

2. Description of the Prior Art

Non-volatile memories with electric writing and erasure, known as EEPROM memories, which is short for "Electrically Erasable and Programmable Read-Only Memory", have an MOS transistor structure, the gate of which transistor is completely insulated (that is to say floating). The voltage state of this gate, which determines the conduction of the MOS transistor, may be modified by injecting thereinto or extracting therefrom a certain quantity of electric charges. A known technique for modifying the charge of the floating gate consists of producing a current, by a tunnel effect via an insulator of very slight thickness, between a doped zone of the substrate, known as an injection zone, and the floating gate. This tunnel effect, also called field emission or Fowler-Nordheim effect, is produced as soon as a sufficiently high voltage exists between the injection zone and the floating gate. As the latter is insulated, application of the required voltage is effected between the injection zone and a control electrode which is coupled capacitively to the floating gate. A memory of this type using the Fowler-Nordheim effect for erasure has been described in U.S. Pat. No. 4,399,523.

Most of the known applications only consider the information stored in the memory as information of the binary type, even though information of the analog type can be obtained by converting several bits thus stored. However, it has already been proposed, in the article by E. Sackinger and W. Guggenbuhl which appeared in the IEEE Journal of Solid-State Circuits, Vol. 23, No. 6, December 1988 and entitled "An Analog Trimming Circuit Based on a Floating-Gate Device", to use the analog quantity stored in an EEPROM memory cell, especially to achieve circuit adjustments. However, the programming techniques used, consisting of applying to the electrodes of the memory continuous or high pulsed high voltages of a definite sign, only allow precise fixing of the charge existing at the floating gate by having recourse to an iterative process of successive measurements and corrections, which must be implemented for each individual cell. As the floating gate is not directly accessible, implementation of this adjusting process has shown itself most often to be delicate and requires, in all cases, additional circuit elements. Moreover, the fact of having to adjust the stored charge limits further the applications of these memories in the analog domain.

SUMMARY OF THE INVENTION

One of the aims of the present invention is precisely to avoid the above-mentioned disadvantages by enabling storage in a memory of a well-defined quantity in a single operation.

Thus, the subject matter of the invention is partly a process permitting storage in a memory cell, of the structure of an MOS transistor with a floating gate, of an analog quantity in a single programming operation.

The subject matter of the present invention is also a process allowing usage of the same means for storing an analog or numerical quantity or for erasing the stored information.

Another aspect of the subject matter of the invention is a device for implementing said process.

The process according to the invention is applicable to a memory cell comprising an MOS transistor structure with a floating gate formed on a substrate of semi-conductor material, a control electrode coupled capacitively to the floating gate and an injection zone formed in the substrate and separated from the floating gate by an insulator, capable of injecting electric charges into or extracting them from the floating gate. The process is characterized in that an alternating voltage is applied to the control electrode, the amplitude of which voltage decreases from a value superior to a critical value, and a voltage substantially equal to that which must be stored is applied to the injection zone.

According to a variant of the process according to the invention, the alternating voltage to be applied to the control electrode comprises only one positive alternation and one negative alternation of an amplitude equal to the critical value.

A device for implementing the process according to the invention comprises, on the one hand, a memory cell formed on a substrate of semi-conductor material and consisting of an MOS transistor with a floating gate, a control electrode coupled capacitively to the floating gate, an injection zone, separated from the floating gate by an insulator and capable of injecting electric charges into or extracting them from the floating gate and, on the other hand, an alternating voltage generator capable of supplying to the control electrode at least one positive pulse (or half-period) and one negative pulse of an amplitude equal to a given value and means of applying to the injection zone a voltage substantially equal to that which has to be stored.

The voltage stored with the aid of the process and the device according to the invention depends only on the voltage applied to the injection zone during the programming phase. The voltage is, in particular, independent of the value of the alternating voltage applied to the control electrode (as far, however, as that is of the amplitude required to cause a modification of the floating gate charge) and of the duration of programming. Moreover, owing to the process according to the invention, a single electrode only of the memory cell is subjected to a high voltage, independent of the analog voltage to be stored. This constitutes another advantage with respect to the prior art.

Other aims, characteristics and advantages of the present invention will become clearer from a reading of the following description of individual exemplary embodiments. The description is made purely by way of illustration and in relation to the enclosed drawings.

DETAILED DESCRIPTION OF THE DRAWINGS

Although also applicable to memory elements made with the aid of p-well MOS technology, the present invention will be described here in relation to examples made with the aid of n-well CMOS technology. A cell made with the aid of p-well CMOS technology has been described, for example, in the article by J. C. Martin and B. Gerber entitled "A 1.5 V Only CMOS EEPROM based on Fowler-Nordheim Emission—Design, Technology and Applications", which appeared in Swiss Electrotechnical Association Bulletin (Bulletin SEV/VSE), Vol. 75 (1984), No. 3, pp. 140 ff.

Figure 1A:
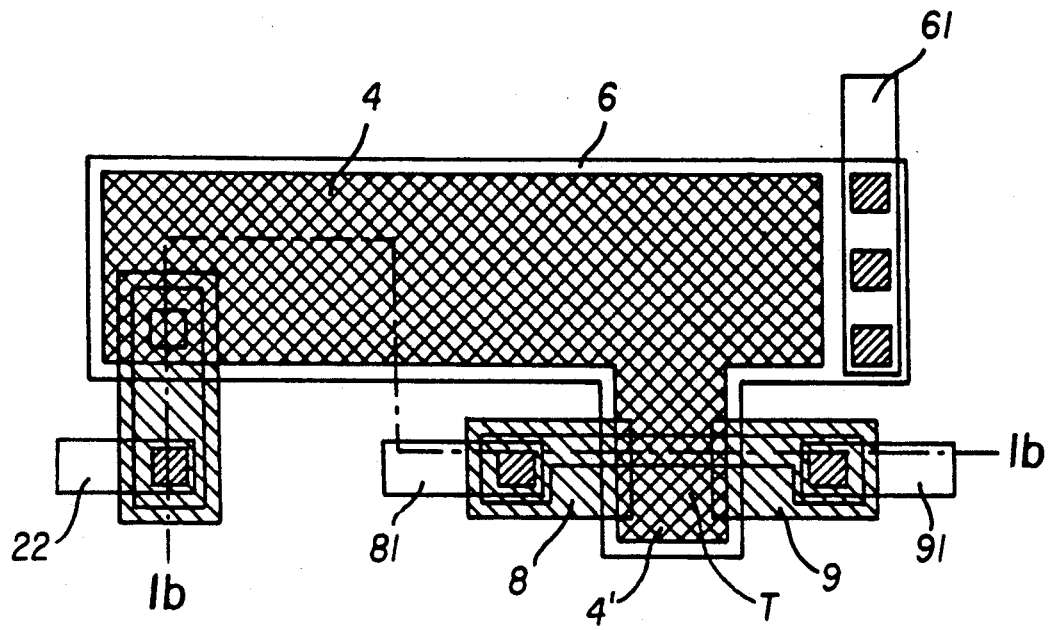
FIG. 1a shows a plan view of a known memory cell capable of being used in the context of the present invention.
Figure 1B:
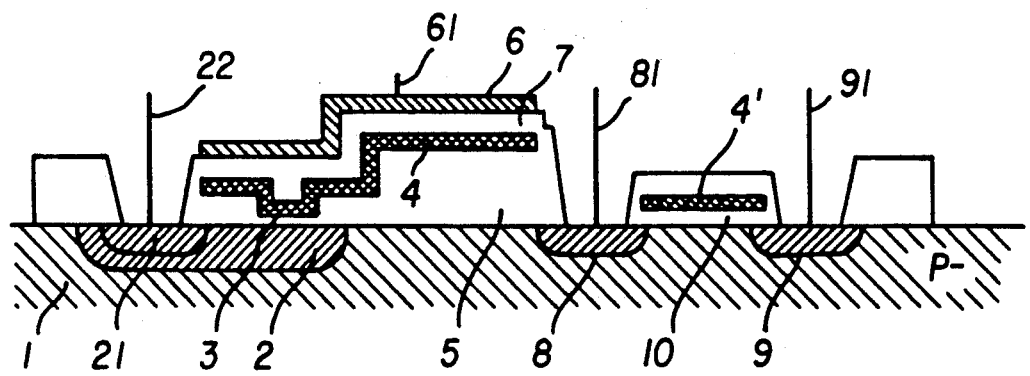
FIG. 1b shows a cross-sectional view taken along line A—A of the cell shown in FIG. 1.

FIG. 1a shows, in section, and FIG. 1b with the aid of a mask plan, a memory cell of a known type. In a p-type semiconductor substrate 1 there are formed three n-type diffusions 2, 8 and 9 respectively constituting the injection zone on the one hand and the source and drain of the read transistor T on the other. The floating gate of polycrystalline silicon 4 is separated from the substrate by a thick oxide 5, from the channel zone of the transistor T by a gate oxide 10 and from the injection zone by a thin injection oxide 3. The control electrode 6, formed of polycrystalline silicon or metal, is coupled capacitively to the floating gate through the intermediary of an oxide 7. The connections 22, 61, 81 and 91 represent the connections with the other circuit elements (not shown) of the injection zone, the control gate and the source and drain of the read transistor respectively. The cell is formed in such a way that the capacitance between the control electrode and the floating gate is large and the Fowler-Nordheim effect can only be produced through the injection oxide. By way of example, in a structure where the injection oxide is an insulator of 10 nm thickness and a surface area of $2\times 2$ $\mu m^2$, the injection threshold (Fowler-Nordheim voltage) is of the order of 10 volts for an injection current of 1 nA. Although a single read transistor T has been shown, it is obvious that the memory cells with several transistors with the floating gate as their gate can likewise be used.

Figure 2A:
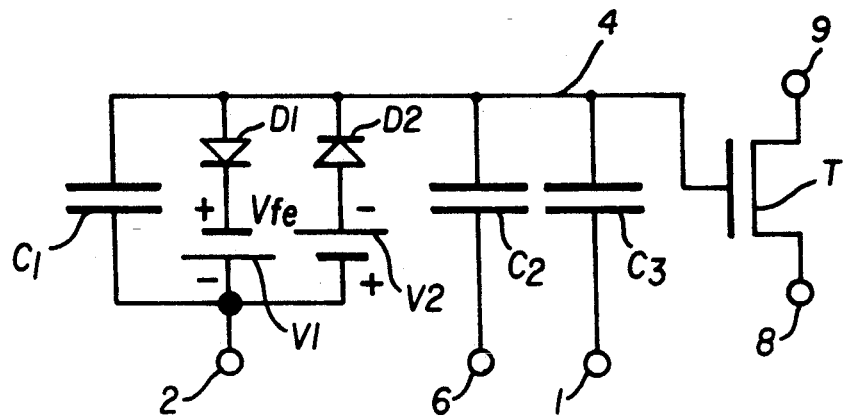
FIG. 2a shows an equivalent diagram of the cell of FIG. 1.
Figure 2B:
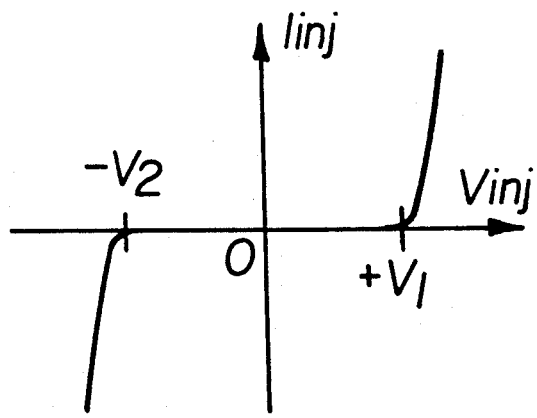
FIG. 2b shows the variation curve of the injection current as a function of the applied voltage.

An equivalent diagram of the cell of FIG. 1 is shown in FIG. 2a. The floating gate 4 is coupled to the substrate 1 by a capacitor C3, to the control gate by a capacitor C2 and to the injection zone 2 by a parallel arrangement formed by a capacitor C1 and two diodes in opposing directions. The two diodes are symbolized by the series connection of an ideal diode D1 (or D2 respectively) and a voltage source V1 (or V2 respectively). FIG. 2b shows the variation in injection current, via the injection oxide 3, as a function of the voltage applied to the injection zone 2. This current is positive when the voltage applied is equal or superior to the critical voltage V1, negative when the voltage is equal or inferior to $-V2$, and nearly zero when the voltage is between $-V2$ and $+V2$.

Figure 3A:
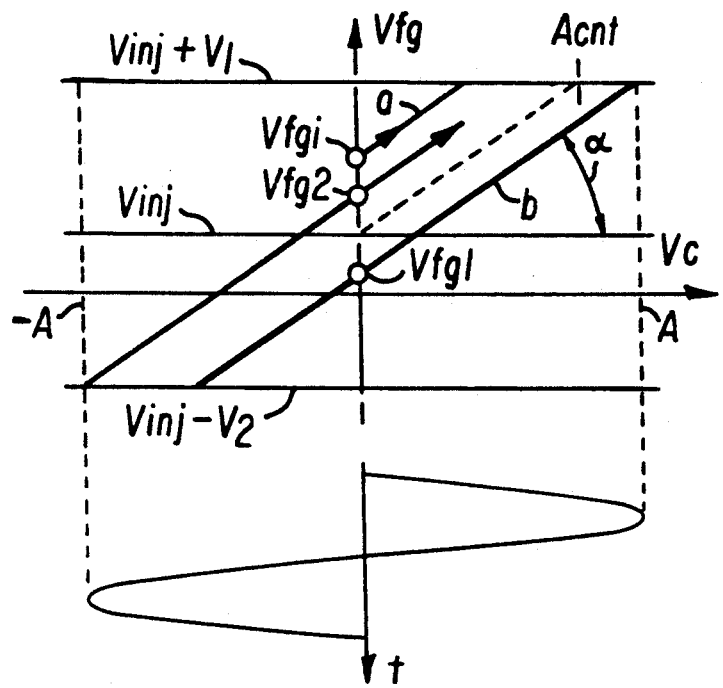
FIGS. 3a and 3b show the evolution of the voltage of the floating gate when an alternating voltage (FIG. 3a) or alternating and decreasing voltage (FIG. 3b) is applied to the control electrode.

FIG. 3a shows the evolution of the voltage Vfg at the floating gate when, a constant voltage Vinj being applied to the injection zone 2, the control gate is subjected to an alternating voltage Vc of amplitude A. At the beginning, when Vc=0, the voltage at the floating gate has any initial value Vfgi, then, when Vc increases, the voltage Vfg also increases following a straight line "a" with a slope $a=C2/(C1+C2+C3)$ up to as a value Vinj+V1, which it maintains as long as Vc continues to increase. When Vc decreases, the voltage Vfg decreases following another straight line "b" with the same slope $a$ which cuts the axis of Vc=0 at the point Vfg1=Vinj+V1$-a.$A. After the negative alternation of Vc, the value of the voltage at the floating gate when Vc=0 is: Vfg2=Vinj$-$V2+$a.$A. If the voltages V2 and V2 are such that: V1=V2 and the amplitude A has a critical value Acrit=V1/c, there is thus obtained: Vfg1=Vfg2=Vinj.

It may be that the voltage Vinj used during the storage phase is no longer available or has varied at the moment of reading the stored information. In this case, if Vinja designates the value of Vinj during storage and Vinjm its value at the moment of reading, the read value Vfgm of the voltage of the floating gate will be: Vfgm=Vinja$-\beta$(Vinja$-$Vinjm), where $\beta$ is equal to C1 / (C1+C2+C3), i.e.: $\beta=a$(C1 / C2). The coefficient $\beta$ will in practice be small with respect to 1 such that the voltage Vfg is hardly modified between storage and reading.

Figure 3B:
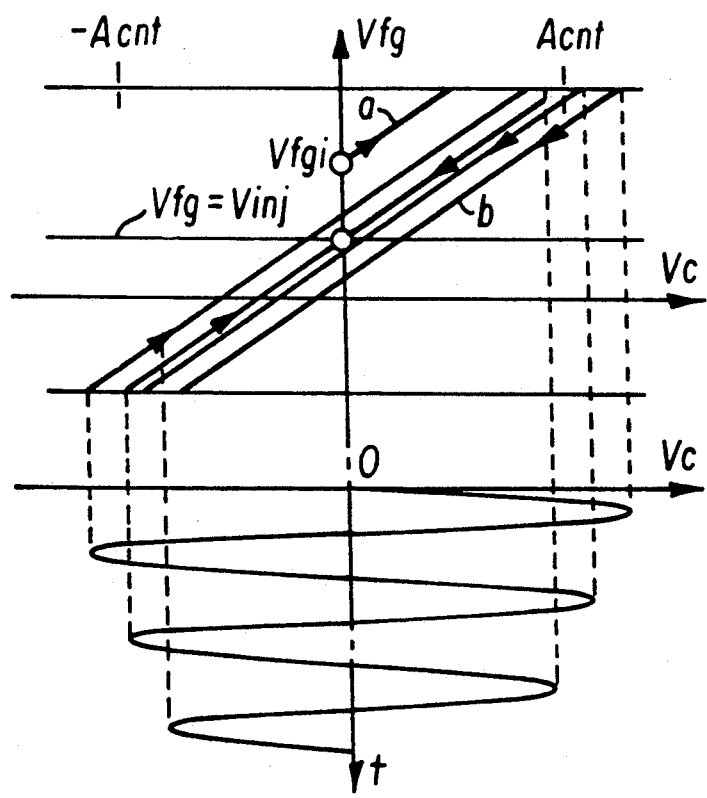

FIG. 3b shows how the voltage Vfg of the floating gate converges towards the value Vinj of the voltage applied to the injection zone if the amplitude of the alternating voltage, applied to the control gate, decreases regularly from a value higher than to a lower value than the critical value Acrit mentioned above.

It may be deduced from the above that after an excursion by the control voltage between the values $+$Acrit and $-$Acrit, the residual voltage Vfg at the floating gate is independent of the Fowler-Nordheim voltages V1 and V2, at least when the latter are equal, of the initial voltage Vfgi and of the coupling factor $a$. This residual voltage depends only upon the voltage Vinj applied to the injection zone. If the voltages V1 and V2 are not equal, that is to say if the Fowler-Nordheim effect does not occur symmetrically, the residual voltage at the floating gate will then show an offset with respect to the applied voltage Vinj. This offset is constant and equal to (V1$-$V2)/2. The critical value Acrit of the control voltage is the minimum value of Vc for which there is produced a modification of the charge of the floating gate. If this critical value is not known precisely, it suffices to apply to the control electrode an alternating voltage of an amplitude decreasing from a value higher than the critical value Acrit. The last value Vfg of the voltage at the floating gate which differs from the preceding values Vfg is that which corresponds to the critical value Acrit of Vc. It should be noted that if a continuous voltage is superimposed on the alternating voltage applied to the control electrode and is maintained during the read phase, the residual voltage at the floating gate is not affected thereby.

The process according to the invention thus consists of applying to the electrode 22, connected to the injection zone 2, a voltage substantially equal to the voltage to be stored and of applying simultaneously to the control electrode an alternating voltage the amplitude of which decreases from a higher value than the critical value Acrit for which modification of the charge of the floating gate may intervene. According to a variant, the alternating voltage to be applied to the control electrode comprises only a positive alternation and a negative alternation of an amplitude equal to said critical value. According to a preferred embodiment, the alternating voltage is sinusoidal.

Owing to the process according to the invention, it becomes possible to store simply and precisely an analog quantity represented in the form of a voltage. A device permitting implementation of the process according to the invention thus comprises a memory cell of the type described above, means for producing and applying to the control electrode an alternating voltage, of which a positive and negative alternation at least has an amplitude equal to said critical value, independent of the voltage to be stored, and means of applying to the injection zone the voltage to be stored. Examples of application will now be described.

Figure 4:
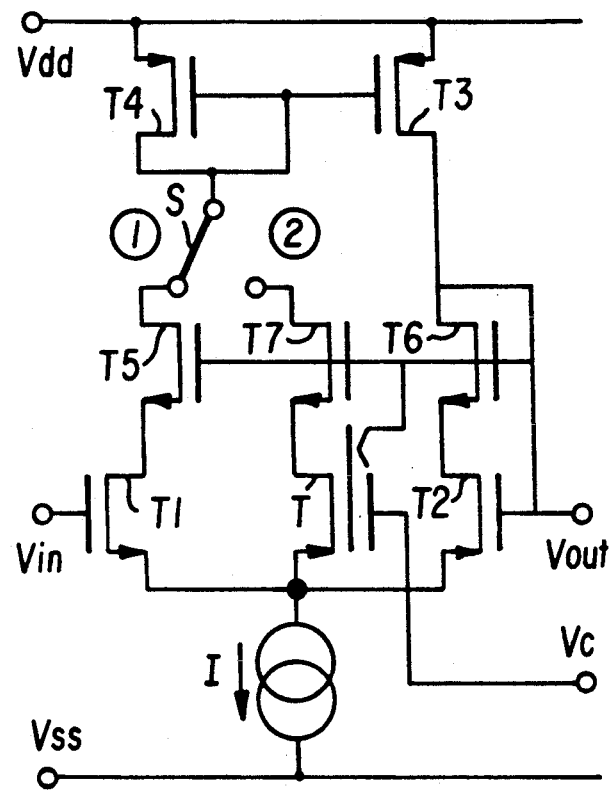
FIG. 4 shows an adjustable voltage source using a memory cell according to the principles of the invention.

FIG. 4 shows an adjustable voltage source using a memory cell programmed according to the process according to the invention and made with the aid of n-well CMOS technology. The adjustable voltage source comprises a differential amplifier formed of the transistors T1 and T2, the gates of which are connected to the input Vin and the output Vout respectively, a current source I connected between the supply Vss and the sources of T1 and T2 and a current mirror consisting of the transistors T3 and T4 connected to the positive terminal Vdd of the supply. The circuit further comprises the transistors T5 and T6, connected in series with the transistors T1 and T2 respectively, with their gates connected to the output terminal Vout and forming a cascode assembly with T1 and T2. An additional branch, consisting of the read transistor T of a memory cell according to the present invention and a transistor T7 identical to the transistors T5 and T6 may be connected instead and in the place of the transistors T1 and T5 owing to the switch S. During a storage phase 1, the voltage Vin applied to the gate of T1 and reproduced, via the differential mounting, at the gate of the transistor T2 and at the injection zone of the memory cell, is stored at the floating gate of the read transistor T by applying a suitable alternating voltage Vc to the control electrode of the memory cell. During the read phase 2, the transistors T and T7 replace the transistors T1 and T5, in such a way that it is the voltage of the floating gate which determines the output voltage. This voltage is also applied to the injection zone, so as to eliminate the error produced by capacitive coupling to the floating gate.

Figure 5:
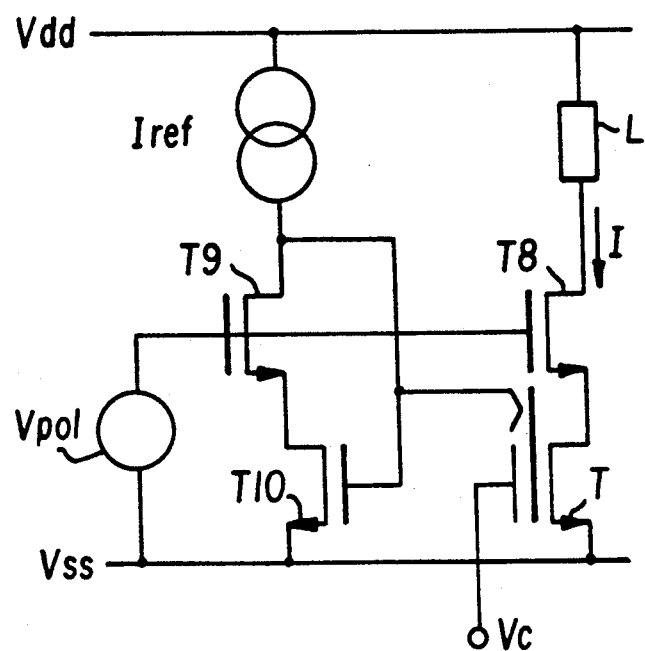
FIG. 5 shows an adjustable current source.

FIG. 5 shows an adjustable current source. In the read phase, the current source comprises the transistor T of a memory cell according to the principles of the invention and a decoupling transistor T8. The current I supplies any load circuit L. A circuit associated with the storage phase comprises a reference current source Iref, a decoupling transistor T9 and a transfer transistor T10. The gate of T10 is connected to the drain of T9 and the voltage Vpol is selected in such a way that T10 operates at a low drain voltage. The gate of T10 is also connected to the injection zone of the memory cell. The transistors T8 and T9 on the one hand, and the transistors T10 and T on the other are preferably matched. During the storage phase, an appropriate alternating voltage Vc is applied to the control electrode of the memory cell, which has the effect of ensuring the transfer of the voltage from the gate of T10 to the floating gate. When the control voltage Vc has disappeared, the voltage of the floating gate will be maintained. Numerous variants of this circuit are possible. For example, several branches identical to the arrangement T/T8 may be connected in parallel to supply several different load circuits with one and the same current I. The read transistor T may be short-circuited during the storage phase to keep at zero the source and the drain and to improve the precision of the stored value.

Figure 6:
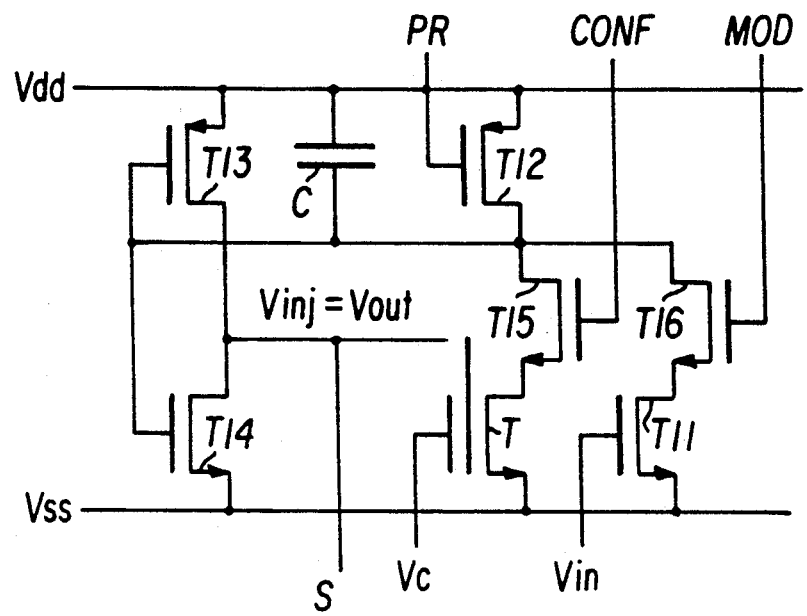
FIG. 6 shows a digital memory circuit of binary type.

FIG. 6 shows a memory circuit in which the memory cell is used to store binary information. For the operation of the circuit, there may be distinguished a pre-charge phase, during which the inputs CONF, MOD, Vc and PR are at zero, a read phase, during which the inputs MOD, Vc and PR are still at zero but the input CONF changes to 1, and a write phase, during which the voltage Vc is an alternating voltage of appropriate value, the inputs PR and CONF are at zero, the input MOD is at 1 and an input signal Vin is applied to the gate of the transistor T11. During the pre-charge phase, the transistor T12 conducts, the T13, T15 and T16 are blocked and the circuit does not consume any current. During the read phase, the output S assumes a value which depends on the state of conduction of the transistor T, transmitted by the transistor T15, the capacitor C and the invertor T13-T14, and thus on the charge which has been stored at the floating gate. During the write phase, the input signal Vin applied to the gate of the transistor T11 is transferred, via the transistor T16 and the invertor T13-T14, to the injection zone of the memory cell and it is stored at the floating gate. Numerous variants of this arrangement are possible, as well as a matrix organization of the memory cells. It should be noted that the high voltage Vc is applied, during the write phase, in a non-selective manner to the control electrodes, independently of the value of the voltage to be stored. Furthermore, in contrast to prior art memories there is no reason to distinguish the write operation from the erasure operation. The voltage Vin to be stored (logic 0 or 1) is applied in all cases to the injection zone, without distinction of the value previously stored.

Figure 7:
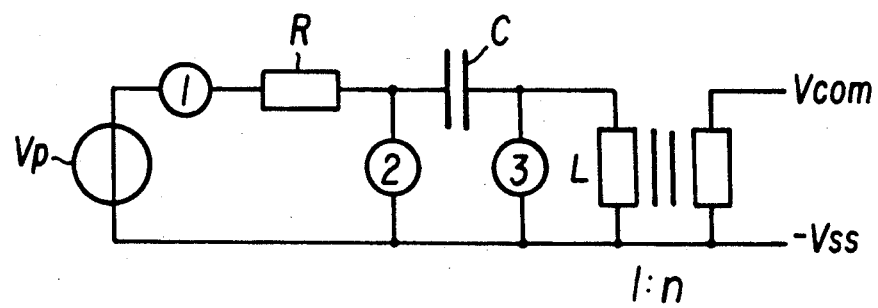
FIG. 7 shows a diagram of a generator of damped sinusoidal voltage.

FIG. 7 shows an example of a generator for the control voltage Vc using an L-C type resonant circuit. In a preparatory phase, the capacitor C is charged via a resistor R and a switch 1 to the voltage Vp of a voltage source and the inductor L is short-circuited by the switch 3 so as not to disturb the output Vc. In the transfer phase, the capacitor C is abruptly earthed by the switch 2 while the switches 1 and 3 are open. A damped sine wave is generated in the inductor L, the initial amplitude of which is equal to Vp at the primary and $\eta.Vp$ to at the secondary, where n is the transformer voltage ratio. By way of example, if Vp=5 V and n=4, the amplitude of the first alternation of Vc is 20 volts. The resonant frequency of the L-C circuit should be from 10 to 100 kHz. Below these values, the duration of writing becomes too great and above them the endurance of the memory cells risks being affected.

The preceding circuit may be notably improved if the voltage Vp is controlled by the Fowler-Nordheim voltages (V1 and V2). In this case, the voltage Vc will be just sufficient to ensure storage. Another improvement consists in shortening the storage phase by damping the L-C circuit as soon as the amplitude of the voltage Vc is lower than said Fowler-Nordheim voltages, in order to return very rapidly to the preparatory phase. This may be effected simply for the person skilled in the art by means of an amplitude detector, a delay circuit or the like, or appropriately choosing the clock signals which control the switches 1, 2 and 3.

Figure 8:
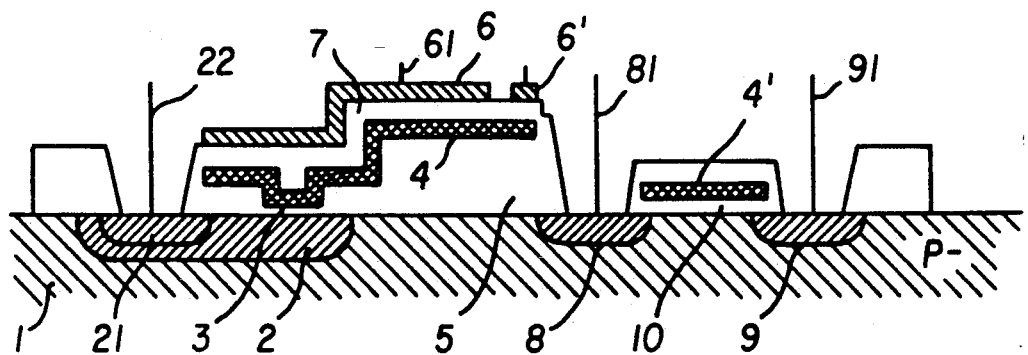
FIG. 8 shows a memory cell according to the invention comprising an additional correction electrode.

It has been mentioned above that the Fowler-Nordheim effect could not operate symmetrically and that there resulted offset between the voltage applied to the injection zone and the voltage stored at the floating gate. A usable means of correction consists of applying to the control gate, during the read phase, a correction voltage which may be determined by measuring the above-mentioned shift at a reference memory cell for which the voltage applied to the injection zone during the storage phase is permanently available during the read phase. Another solution which enables decoupling of the correction circuits from the control circuits consists of using an additional control electrode 6', the surface of which is much smaller than that of the control electrode 6 so as not to downgrade the coupling factor $\alpha$. A cell comprising such a correction electrode is illustrated in FIG. 8, in which the elements similar to those of FIG. 1a have the same reference numerals.

Figure 9:
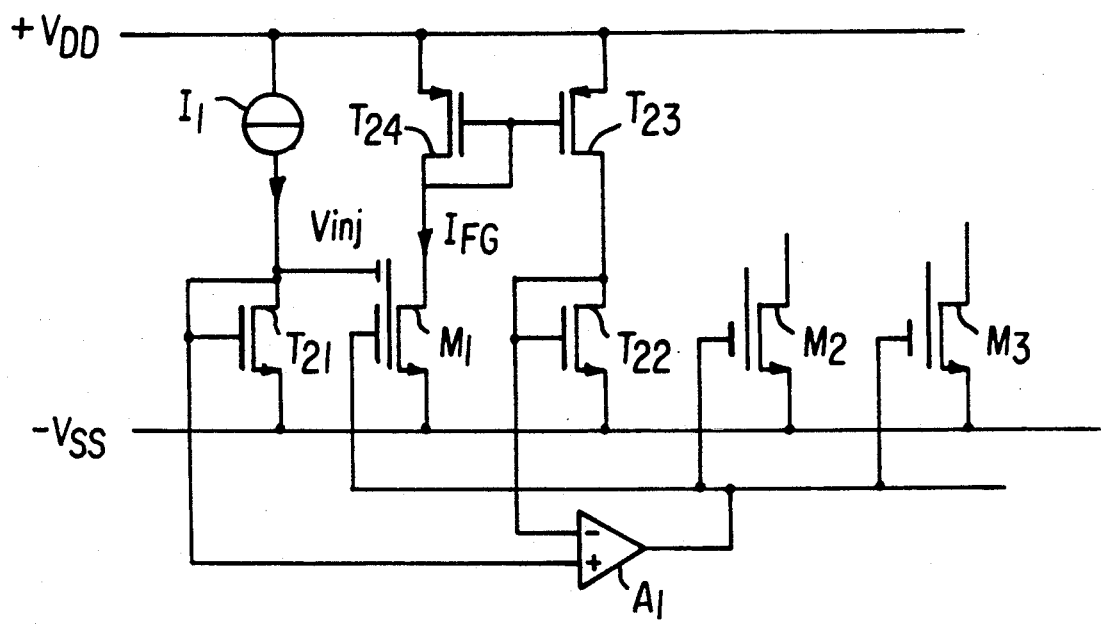
FIG. 9 shows a circuit which can be used to correct the stored value.

FIG. 9 shows an example of a circuit enabling correction of the stored value. The transistors T21, T22 and the read transistors of the reference memory cell M1 and of the memory cells M2, M3 are matched n-channel MOS transistors. The transistors T23 and T24 are p-channel MOS transistors, which are also paired and which form a current mirror. The transistor T21 is supplied by a current source I1 in such a way that the voltage Vinj at its drain is near its threshold voltage. During storage (the means of which are not shown in this Figure) the voltage at the floating gate of M1 adjusts to a value Vfg=Vinj+Voff, where Voff represents the above-mentioned offset voltage between the voltage applied to the injection zone and the voltage stored at the floating gate; it being possible for said shift voltage to exist if, for example, the Fowler-Nordheim effect is not symmetrical. The current generated in the transistor M1 by the voltage of its floating gate is duplicated in the transistor T22 by the current mirror T23-T24. The comparison of the current I1 and the current generated by M1 is effected by comparing, by means of a differential amplifier A1, the gate voltages of the transistors T21 and T22. The output of the amplifier A1 is then applied to the correction electrodes of the memory cells M1, M2, M3, . . . , which are supposedly identical and have the same phase shift voltage. In this way, the offset between the write and the read voltages is reduced in the reference memory cell M1 as well in the cells M2 and M3.

Figure 10:
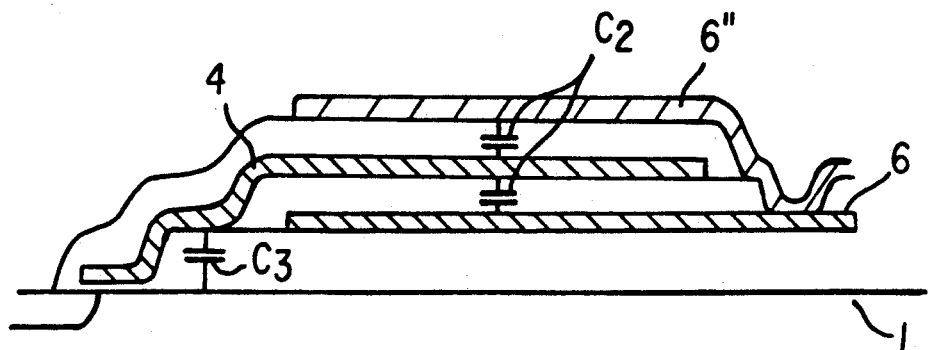
FIG. 10 shows a cross-sectional view of another variant of the memory cell of FIG. 1.

FIG. 10 shows, in section, a particular embodiment of a memory cell of CMOS technology with two levels of polycrystalline silicon. In this embodiment, the floating gate 4 is effected with the second level of polysilicon and it is "sandwiched" between a layer of polycrystalline silicon of level 1 and a layer of metal forming the control electrode 6. This arrangement permits, for a given coefficient of coupling between the control gate and the floating gate, the production of a smaller cell than that of FIG. 1 and, moreover, it offers a reduced capacitance C3 between the floating gate and the substrate.

Although the present invention has been described by means of particular exemplary embodiments, it is clear that the latter are capable of modification and variation without going beyond the scope thereof. In particular, memory cells using the principles of the present invention may advantageously find application in the production of analog artificial neural networks by permitting the storage and adjustment of the analog quantities constituted by the synaptic weights.

What is claimed is:

1. A process for storing an analog quantity in a non-volatile memory cell, wherein said non-volatile memory cell includes at least one MOS transistor comprising an insulated floating gate formed on a semiconductor substrate, a control electrode coupled capacitively to said floating gate, an injection zone separated from said floating gate by a thin insulator, and an injection electrode connected to said injection zone, wherein said injection zone injects electrical charges into or extracts electrical charges from said floating gate in response to the application of an appropriate voltage difference between said control electrode and said injection zone; said process comprising applying to said control electrode a voltage comprising at least a positive alternation and a negative alternation in amplitude at least equal to a value for which there is produced a modification in the charge of said floating gate, and applying to said injection electrode a voltage representing said analog quantity to be stored.

2. The process of claim 1, wherein said voltage applied to the control electrode is an alternating voltage of which the amplitude decreases from a value higher than, to a value lower than that for which a modification in the charge of said floating gate is effected.

3. The process of claim 1, wherein said positive and negative alternations of the voltage applied to the control electrode are centered with respect to a potential of said substrate.

4. The process of claim 2, wherein said positive and negative alternations of the voltage applied to the control electrode are centered with respect to a potential of said substrate.

5. The process of claim 1, wherein said positive and negative alternations of the volta ge applied to the control electrode are centered with respect to a potential different from that of said substrate and said potential is applied to the control electrode each time said stored analog quantity is read.

6. The process of claim 2, wherein said positive and negative alternations of the voltage applied to the control electrode are centered with respect to a potential different from that of said substrate and said potential is applied to the control electrode each time said stored analog quantity is read.

7. The process of claim 2, wherein said alternating voltage is a damped sinusoidal voltage.

8. The process of claim 3, wherein said alternating voltage is a damped sinusoidal voltage.

9. The process of claim 5, wherein said alternating voltage is a damped sinusoidal voltage.

10. A memory device comprising:
(a) a non-volatile memory cell comprising at least one MOS transistor with an insulated floating gate formed on a semi-conductor substrate; a control electrode coupled capacitively to said floating gate; an injection zone separated from said floating gate by a thin insulator; wherein said injection zone injects or extracts electric charges into or from said floating gate in response to the application of a voltage difference between said control electrode and said injection zone;

(b) a generator of alternating voltage, an output of which is connected, at least during the storage phase, to said control electrode and of which the amplitude of at least a positive alternation and a negative alternation of said alternating voltage is equal to said value for which a modification in the charge of said floating gate is produced;

(c) injection means for directly applying to said injection zone, at least during said storage phase, a voltage representing the quantity to be stored, wherein said injection means includes an injection electrode connected to said injection zone; and (d) at least one MOS transistor, the gate of which is connected to said floating gate.

11. The device of claim 10, wherein said alternating voltage generator supplies a damped sinusoidal voltage.

12. The device of claim 10, further comprising a correction electrode coupled capacitively to said floating gate and to which is applied a correction voltage to compensate for an offset between said voltage to be stored and the voltage actually stored at the floating gate.

13. The device of claim 11, further comprising a correction electrode coupled capacitively to said floating gate an which is applied a correction voltage to compensate for an offset between said voltage to be stored and the voltage actually stored at the floating gate.

14. The device of claim 10, wherein said control electrode comprises two electrically connected portions arranged on either side of said floating gate.

* * * * *